United States Patent [19]

Comer

[11] 4,088,905
[45] May 9, 1978

[54] SELF-ADJUSTING COMPATIBILITY CIRCUIT FOR DIGITAL TO ANALOG CONVERTER

[75] Inventor: Donald T. Comer, Los Gatos, Calif.

[73] Assignee: Precision Monolithics, Inc., Santa Clara, Calif.

[21] Appl. No.: 768,867

[22] Filed: Feb. 15, 1977

[51] Int. Cl.² ............... H03K 5/156; H03K 5/18; H03K 13/02
[52] U.S. Cl. ............... 307/358; 307/261; 307/356; 307/362; 328/27; 328/150; 340/347 DA
[58] Field of Search ............... 307/261, 350, 355, 356, 307/357, 358, 362; 328/27, 150

[56] References Cited

U.S. PATENT DOCUMENTS

| 3,717,777 | 2/1973 | Cecil | 307/296 |
|---|---|---|---|
| 3,879,669 | 4/1975 | Moriyasu | 307/358 X |
| 3,942,038 | 3/1976 | Hutch | 307/358 |
| 3,961,326 | 6/1976 | Craven | 340/347 DA |
| 3,999,083 | 12/1976 | Bumgardner | 307/358 |

OTHER PUBLICATIONS

Croisier et al., "Data Threshold Circuit", IBM Tech. Discl. Bull.; vol. 14, No. 2, pp. 666–667; 7/1971.

Primary Examiner—Larry N. Anagnos
Attorney, Agent, or Firm—Poms, Smith, Lande & Glenny

[57] ABSTRACT

A circuit for interfacing a digital to analog converter with input signals from three different logic systems, whereby appropriate threshold switching signals compatible with each logic system are presented to the converter when the proper logic control signal is applied to the circuit. The first logic system is characterized by logic control signals within a first voltage range, and switching thresholds which differ from the logic control signals by a fixed increment; the second system by logic control signals within a second voltage range higher than the first range, and switching thresholds equal to a fixed proportion of the logic control signal; and the third system by a substantially constant switching threshold for a predetermined positive supply voltage level.

20 Claims, 7 Drawing Figures

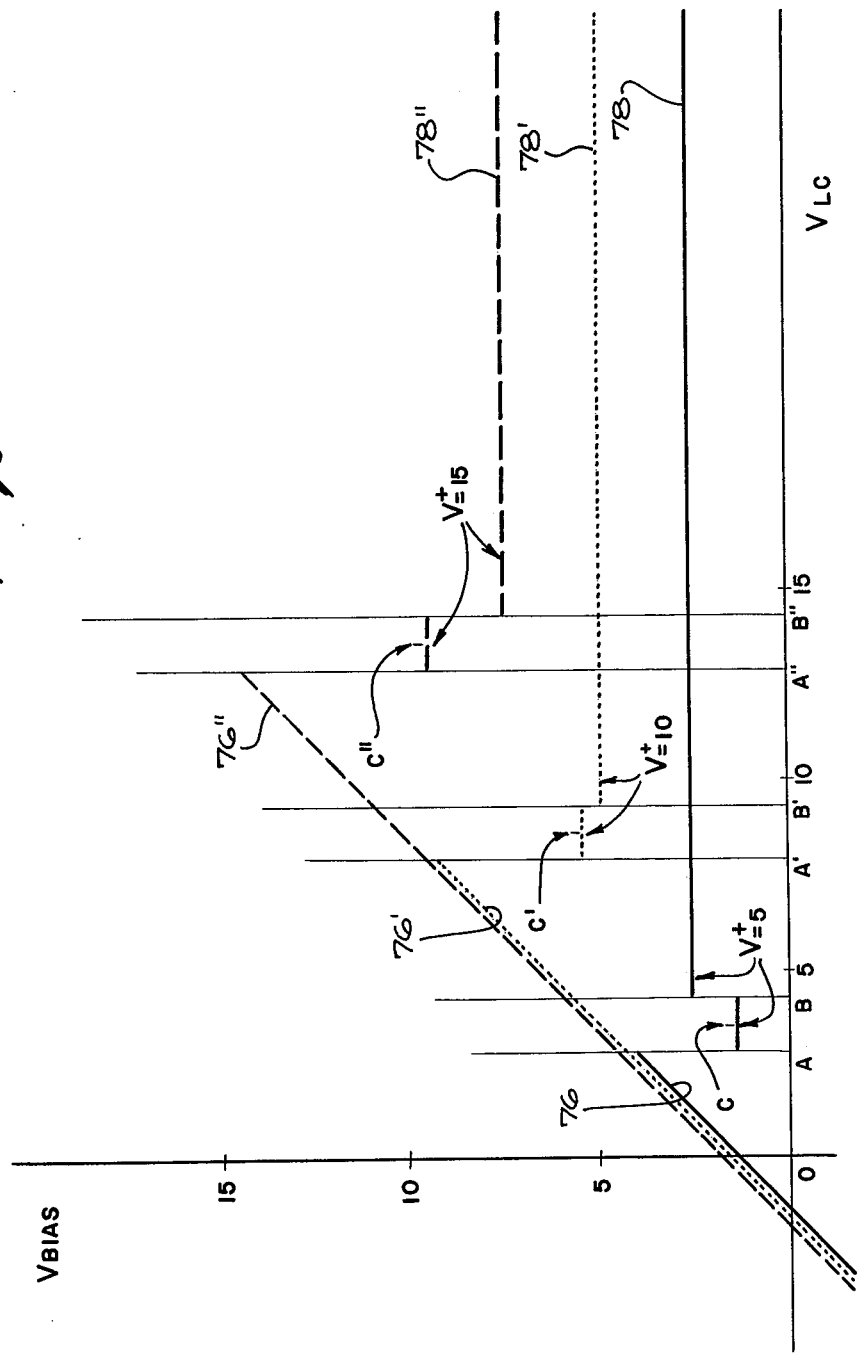

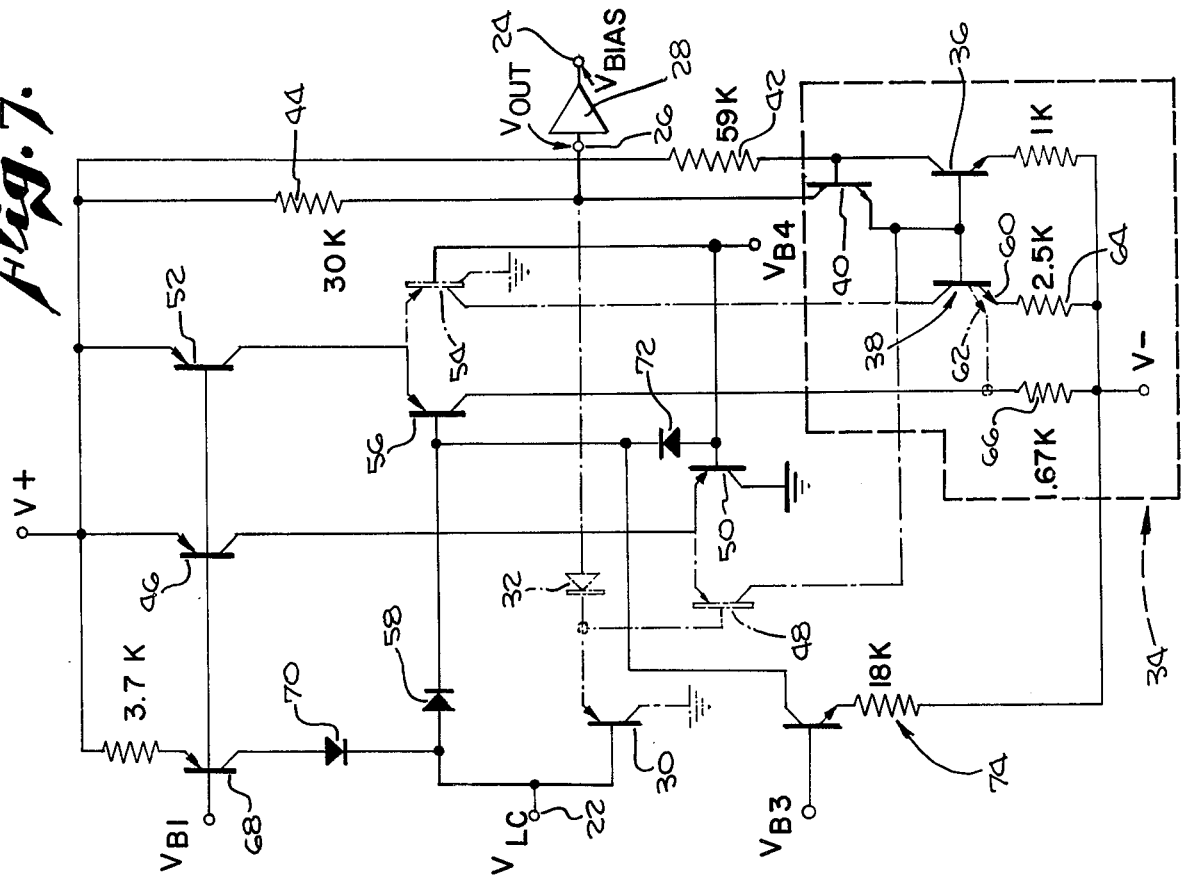
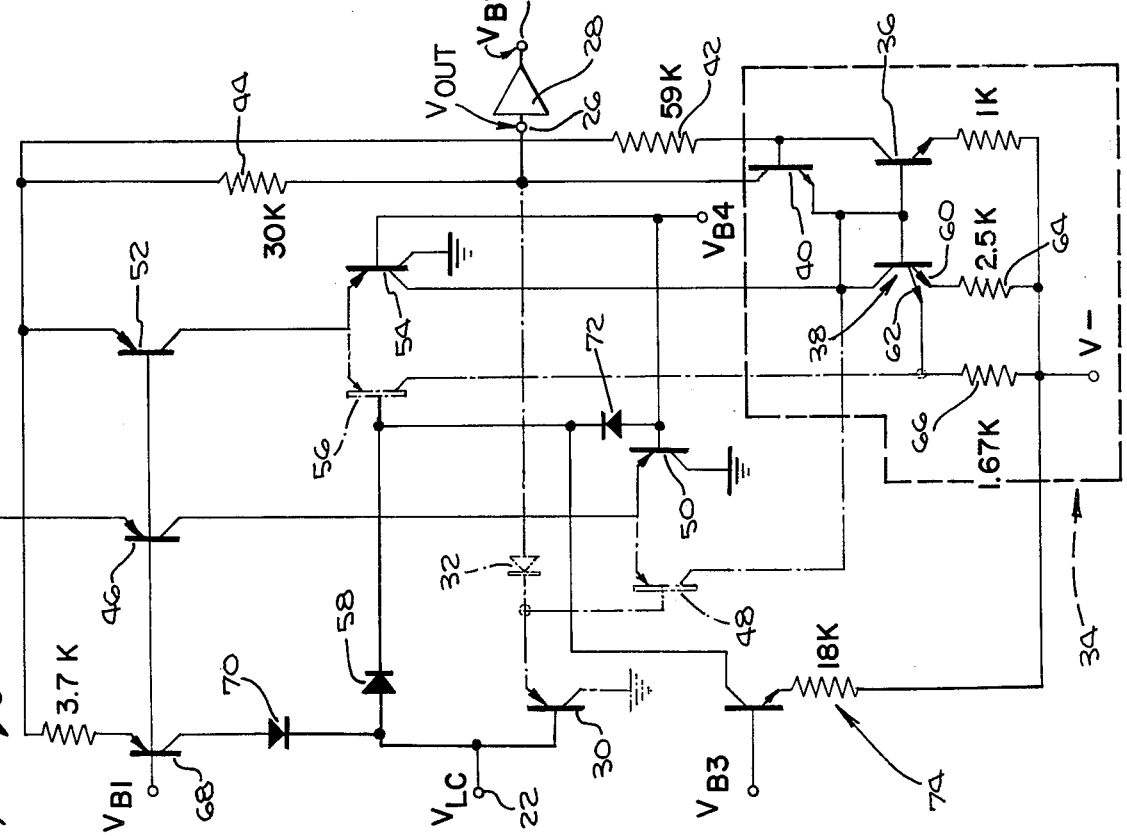

SELF-ADJUSTING COMPATIBILITY CIRCUIT FOR DIGITAL TO ANALOG CONVERTER

BACKGROUND OF THE INVENTION

1. Field of the Invention

This invention relates to electric circuits, and more particularly to a circuit adapted to be implemented in integrated circuit form as an auxiliary to a digital to analog converter.

2. Description of the Prior Art

Digital to analog converters (DACs) employ a plurality of stages or bits to convert a multi-signal digital input to a unitary signal analog output. Assuming a binary coded input, one bit would be assigned to each digit of the binary code. For a given binary input, some of the digits would carry a logic "one", and the other digits a "zero". Those bits associated with the digits having a "one" each produce an output signal, the magnitude of which is proportional to the order of the digit. The individual bit outputs are accumulated to produce a net output which is the analog equivalent of the digital input signal.

In operating a DAC, the ability to discriminate between a "one" and a "zero" is essential. A common method for accomplishing this employs a differential switch in each bit. One branch of the switch is biased at a constant voltage which is less than the logic input signals but great enough to exclude the effects of normally encountered noise, while the second branch is biased by the logic signal itself. During the presence of a logic "one" at the second branch, the bit current is directed through the switch to an output terminal which also receives current from all of the other bits to which a logic "one" has been applied. Those bits which have received logic inputs exceeding the threshold established by the bit bias level contribute to the total output analog signal, while the remaining bits do not.

Numerous different logic systems have been developed, each having its own particular characteristics, advantages, and disadvantages. Each logic system with which the DAC may be used has associated with it a threshold bias level for switching the bits. In several logic systems the bit threshold level is relatively low. Such systems include positive doped metal oxide semiconductor (PMOS) logic, negative doped metal oxide semiconductor (NMOS) logic, emitter coupled logic (ECL), and integrated injection logic $I^2L$. In all of these systems, the threshold bias level for bit switching is less than 1.4 volts, and generally about zero. For CMOS, unlike the first category of logic systems, the bit threshold level depends upon the supply voltage and is generally equal to one half of the positive voltage supply. A third category comprises transistor transistor logic ($T^2L$), in which the bit threshold level is about 1.4 volts.

In view of the disparate types of logic systems available a complete replacement of a DAC may be necessary to convert from operation in one category to operation in another. Greater economy and efficiency can be achieved by providing a universal DAC capable of being programmed for compatibility with any of the above logic systems. Different DAC manufacturers have recently recognized this fact and developed means of adjusting the bit switching threshold with a programmable or user selected logic control voltage. However, up to this point there does not appear to be any uniformity in the selection of the relationship between the bit switching threshold and the logic control voltage. For example, some manufacturers require that the logic control voltage be forced to zero by grounding in order to achieve a switching threshold at 1.4 volts, while others require that the logic control input be left open circuited to achieve the 1.4 volt threshold. Thus, different DACs designed for a particular logic system may require different control. In addition, most manufacturers provide programmability for only two of the three general categories of logic systems discussed above, since providing for all three simultaneously produces some design conflicts.

SUMMARY OF THE INVENTION

In view of the above problems associated with the prior art, the principal object of this invention is the provision of a novel and improved circuit to make a DAC compatible with a plurality of different logic systems, including the three systems discussed above.

Another object is the provision of such a circuit in which the required logic control is sufficiently flexible to allow compatibility with more than one type of DAC control scheme.

A more specific object is the provision of a circuit providing a programmable interface between a DAC and any one of a plurality of logic systems, one of the systems being characterized by bit threshold bias levels which differ from the logic control signal by a fixed increment, another system by logic control signals substantially equal to the positive supply voltage within a second and higher voltage range and threshold bias levels equal to a fixed proportion thereof, and a third system by an open circuit logic control signal and a substantially constant threshold level for a predetermined positive voltage supply level.

In the realization of these and other objects, the logic compatibility circuit of the present invention employs separate but interrelated subcircuits between a logic control input terminal and an output terminal adapted to provide a DAC threshold bias level. A voltage incrementing circuit is connected between the two terminals to hold the output signal at a predetermined increment from the input signal and thereby satisfy the requirements of the first category of systems. Means are provided to decouple this circuit connection when the logic control signal at the input terminal exceeds a predetermined threshold corresponding to the upper limit of the logic control voltage range for this category.

A variable-ratio current mirror, which is disabled when the logic control voltage is within the first range, is connected between the positive and negative supply buses and interconnected with the output terminal to establish the output voltage when the logic control signal exceeds the first range. The output of an offset current source is delivered to the mirror in response to the logic control voltage exceeding a second threshold level corresponding to the lower limit of the second range. The magnitude of the offset current is such as to substantially cancel out the effect of the negative supply bus on the mirror current so that the output bias voltage varies in substantially direct proportion to the positive supply voltage, thereby satisfying the requirements of the second category of logic systems.

Appropriate circuitry is provided to constrain the logic control voltage to a third range between the first and second ranges for an open circuit logic control signal. Within this third range a ratio adjustment circuit operates to adjust the mirror ratio to a level at which the current drawn by the mirror establishes an output bias voltage which is compatible with the third category of logic systems.

DESCRIPTION OF THE DRAWINGS

Further advantages and features of the invention will be apparent to those skilled in the art from the ensuing detailed description hereof, taken together with the accompanying drawings, in which:

FIG. 4 is a graph showing the input-output signal relationships of the compatibility circuit for three different levels of positive supply voltage; and FIGS. 5, 6 and 7 are circuit diagrams of the logic compatibility circuit of FIG. 2 in three different modes of operation, with inoperative portions of the circuit for each mode indicated in phantom lines.

DETAILED DESCRIPTION OF A PREFERRED EMBODIMENT

Figure 1:
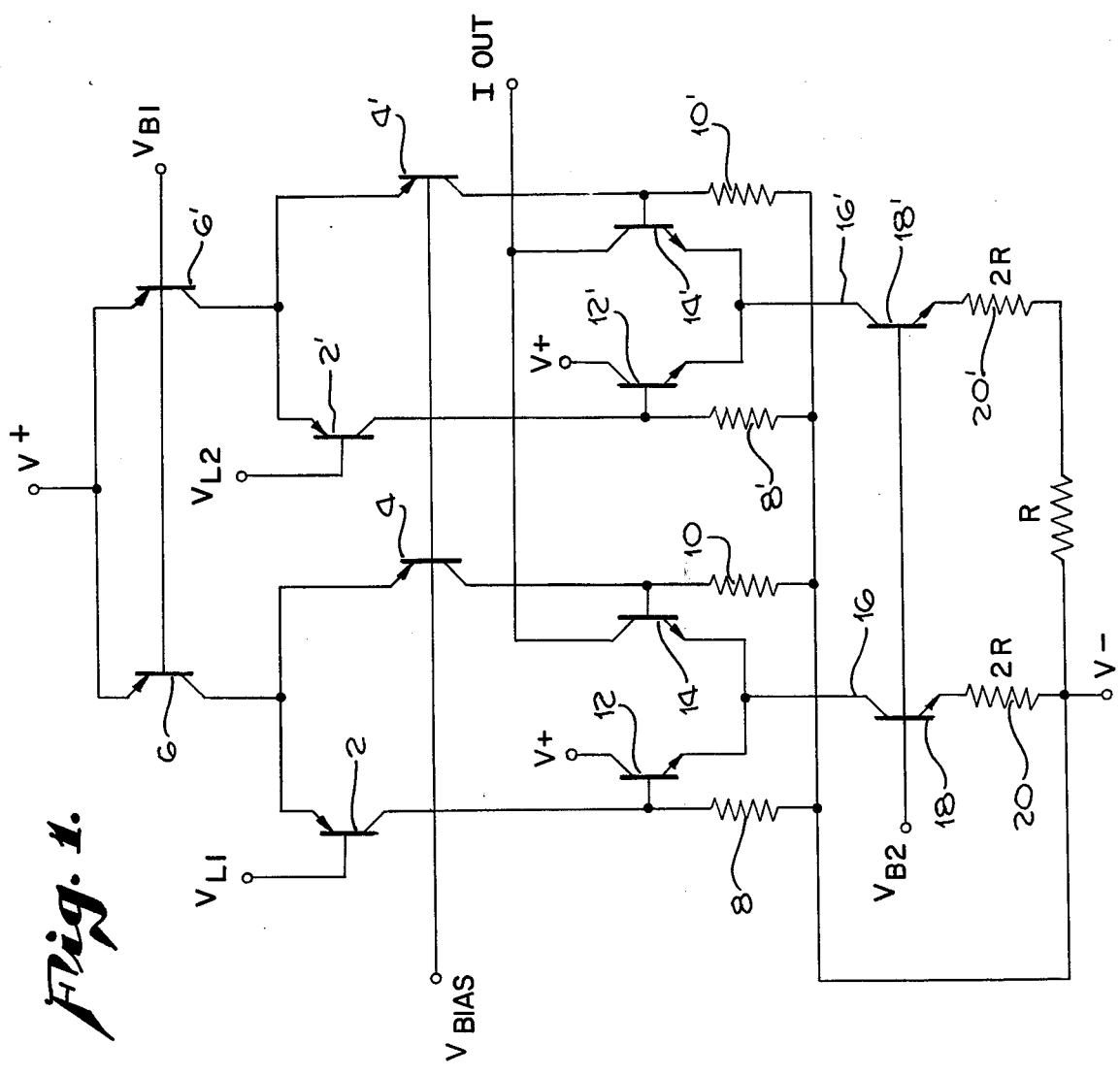
FIG. 1 is a circuit diagram illustrating the biasing of a pair of DAC bit circuits.

A DAC employs a plurality of bit circuits capable of producing output currents of varying magnitudes, the total output being obtained by accumulating the individual outputs of a selected combination of bits. Two bit circuits from a DAC utilizing the well-known R-2R ladder network are shown in FIG. 1. Corresponding elements of the two bits are designated by the same reference numeral, with a ' used for the elements associated with the right hand bit. Each bit includes a switching section with a first differential switch comprising a pair of transistors 2 and 4. The transistors are biased respectively by digital logic signals $V_{L1}$ and $V_{L2}$ associated with each of the bits, and by a common bias voltage $V_{BIAS}$. The differential switch routes the output current of a transistor current source 6 between a pair of bias resistors 8 and 10 to set up biasing for the transistors 12 and 14 of a second differential switch. With a digital input signal present at the base of transistor 2, transistor 12 completes a circuit between the DAC output and the portion of the R-2R ladder network assigned to the bit, causing the bit to produce an output current. In the absence of a bias signal at transistor 2, transistor 14 is actuated to disconnect the bit from the DAC output and connect it instead to a positive voltage supply bus V+. In either case, the bit output current is transmitted from the second differential switch to the ladder over line 16.

The ladder portion of each bit circuit comprises a current source transistor 18 biased in common with the other bits by a common voltage $V_{B2}$, and a 2R resistor 20 connected to the ladder between the emitter of transistor 18 and a negative voltage supply bus V−. For integrated circuit applications, V− is typically −15 volts, while V+ is generally within the range of 5 to 15 volts.

The establishment of a proper $V_{BIAS}$ is critical to the operation of the entire DAC. The bias voltage must be low enough so that the presence of a digital logic signal $V_L$ is readily detected, yet large enough to prevent a false indication due to noise. The criticality of $V_{BIAS}$ is compounded by the fact that different logic systems frequently employ digital input signals $V_L$ of varying magnitude, making the circuit shown in FIG. 1 unuseable for more than one category of digital logic input.

Figure 2:
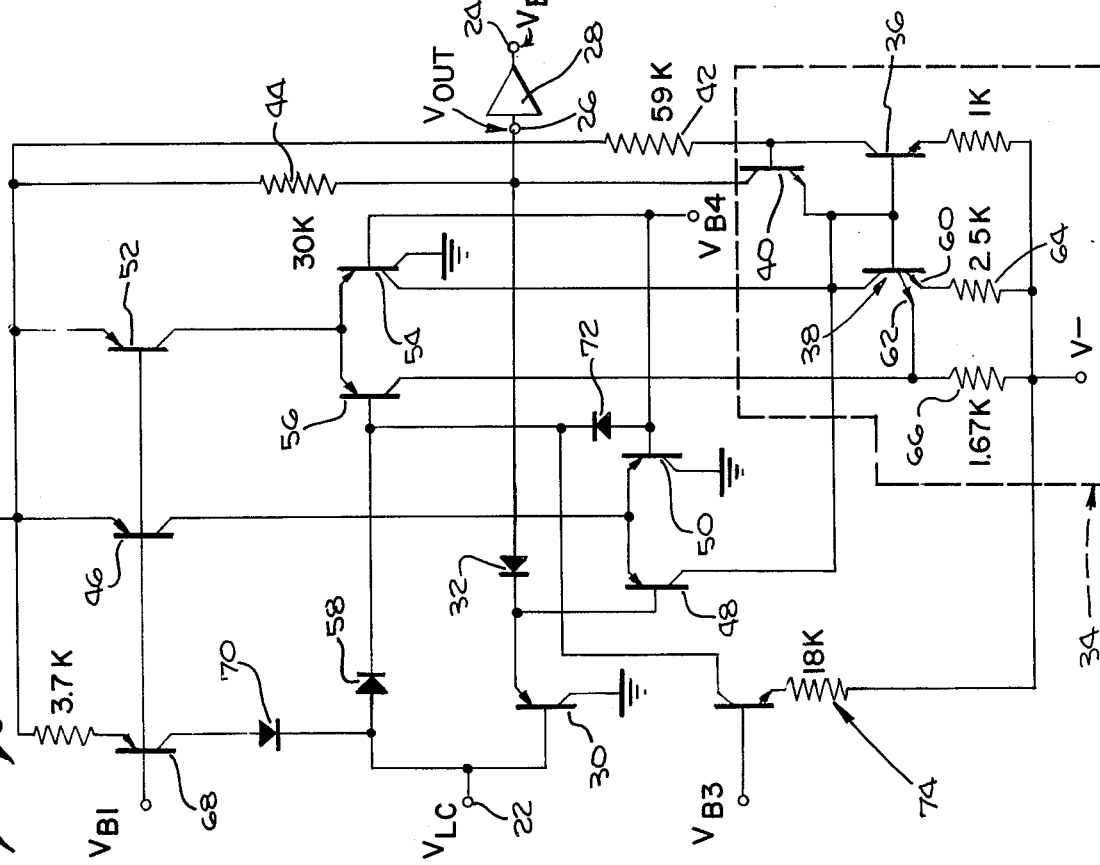
FIG. 2 is a circuit diagram of the logic compatibility circuit which is the subject of this invention.

Referring now to FIG. 2, a logic compatibility circuit is shown which is capable of automatically interfacing the DAC with a number of different kinds of logic inputs, and a variety of logic control signals. The various categories of logic systems for which the circuit is suited were mentioned in the background portion of this application, and may be summarized as follows:

1. Logic control signals ($V_{LC}$) within a first voltage range, and switching threshold levels $V_{BIAS}$ which differ from $V_{LC}$ by a fixed increment;

2. $V_{LC}$ within a second voltage range greater than the first range and substantially equal to the positive supply voltage; $V_{BIAS}$ equal to a fixed proportion, generally half, of V+; and 3. $V_{LC}$ open circuit; $V_{BIAS}$ constant for a predetermined positive supply voltage level.

Figure 3:
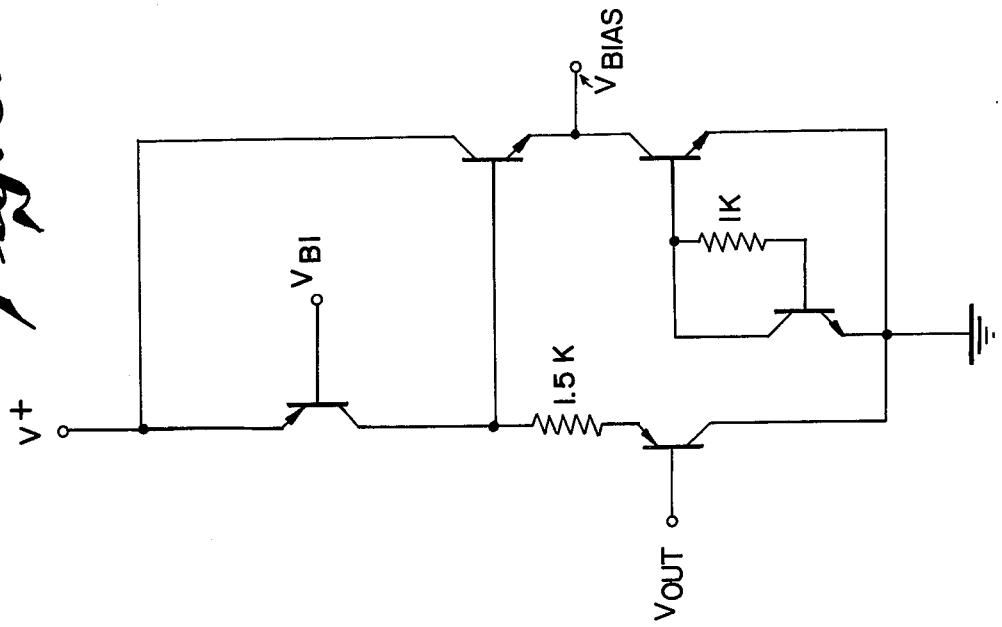
FIG. 3 is a circuit diagam of an output amplifier employed in conjuction with the logic compatability circuit.

The circuit of FIG. 2 has at one end an input terminal 22 adapted to receive a logic control voltage signal $V_{LC}$ appropriate for whatever logic system is employed, and an output terminal 24 at which a threshold switching bias voltage $V_{BIAS}$ for the DAC network is established. An initial output terminal 26 receives the output signal from the compatibility circuit and directs it through a buffer amplifier 28, details of which are shown in FIG. 3, to final output terminal 24.

For $V_{LC}$ within the first range, the input-output relationship is governed by a voltage incrementing circuit comprising a grounded collector PNP transistor 30, the base of which is connected to input terminal 22 for biasing by $V_{LC}$, and a diode 32 connected to conduct current from output terminal 26 to the emitter of transistor 30. When this circuit is active the voltage level at output terminal 26 is held to a value which exceeds the voltage at input terminal 22 by a fixed increment. In the circuit shown an increment of approximately 0.7 volts is added to $V_{LC}$ across the base-emitter junction of transistor 30 and another 0.7 volts in transit across diode 32, resulting in a $V_{BIAS}$ at terminal 26 which tracks and exceeds $V_{LC}$ by approximately 1.4 volts.

For $V_{LC}$ within the second range, the operative portion of the compatability circuit includes a Wilson current mirror circuit 34 shown enclosed in dashed lines. The mirror comprises a reference transistor 36 which established a reference current, a diode-connected, double emitter mirror transistor 38 having its base connected to the base of transistor 36, and an emitter follower transistor 40 which supplies base current to the above two transistors to eliminate base current error.

Reference transistor 36 is connected in series with a resistor 42 between the positive and negative supply buses, and its current is determined by the voltage differential between V+ and V−. Mirror transistor 38 is connected in an overall mirror circuit one portion of which comprises a circuit connection through transistor 40 to output terminal 26, and then through a resistor 44 to the positive supply bus. For a given value of V+ the output voltage is determined by the voltage drop across resistor 44, which in turn depends upon the current drawn by the mirror.

For values of $V_{LC}$ within the first range, the current through resistor 44 is determined by the current drawn through transistor 30 and diode 32 of the voltage incrementing circuit, which essentially bypasses the mirror circuit. In order to supply the mirror current during this mode of operation, a current source transistor 46 is connected to the collector of mirror transistor 38 through a transistor 48 which forms one branch of a differential switch. The other differential switch branch comprises a grounded collector transistor 50 held at a constant bias level $V_{B4}$, approximately 1.4 volts (2 diode drops) below V+. The base of transistor 48 is connected between diode 32 and the emitter of transistor 30; since the voltage at the emitter of transistor 30 will exceed $V_{LC}$ at its base by approximately 0.7 volts, the differential switch formed by transistors 48 and 50 operates when $V_{LC}$ exceeds a threshold voltage equal to (V+ − 2.1). After this occurs the current from source 46 is directed through transistor 50 to ground, terminating the current supplied to the mirror through transistor 48.

Referring now to the condition when $V_{LC}$ is within the second range described above, it is desired that the output voltage be a fixed proportion of V+ (50% of the V+ level for CMOS logic). However, since both the positive and negative voltage supplies contribute to the reference current, which is determined by the differential between these two voltages, the mirrored current changes in response to an increase or decrease in V+ by a lesser percentage than the percentage change in V+. To alleviate this problem, an offset current is generated by current source transistor 52 and delivered to the mirror circuit through a transistor 54 which comprises one branch of a differential switch. The magnitude of the current source is selected such that the current supplied to mirror transistor 38 is equal to the proportion of the mirror current attributalbe to V−. For example, if V− is −15 volts and V+ is +5 volts, three-fourths of the total mirror current would be supplied by source 52; for V− = −15 volts and V+ = +15 volts half the mirror current would be supplied by source 52. To assist in the achievement of an appropriate current value, transistor 54 may be formed in a split collector construction as shown, and is biased in common with transistor 50 by $V_{B4}$.

The other branch of the differential switch comprises a transistor 56 having its base connected to input terminal 22 through a diode 58 which is oriented to conduct current towards the transistor Allowing for a 0.7 volt drop across diode 58 and recalling that $V_{B4} = V+ − 1.4$ volts, differential switch 54–56 operates when $V_{LC} = V+ − 0.7$ volts. This second threshold voltage level corresponds to the lower limit of the second range for $V_{LC}$.

Referring back now to mirror transistor 38, its two emitters 60 and 62 are connected respectively through resistors 64 and 66 to V−. Resistor 66 is connected to the collector output of differential switch transistor 56, and when that transistor is conductive receives a current sufficient to raise the voltage differential across the resistor to a level at which emitter 62 is reverse biased. Since the current drawn by transistor 38 for a given bias condition is determined by the conductive state of each of its emitters, reverse biasing emitter 62 in effect alters the mirror ratio. It will be noted that this ratio adjustment occurs when differential switch 54–56 operates, at the same time the offset current through transistor 54 is either applied or removed from the mirror circuit. The adjustment in mirror ratio is employed to establish appropriate output voltages for the second and third logic systems described above.

In order to establish an appropriate $V_{LC}$ level for the third category of logic systems in which input terminal 22 is open circuited, such that $V_{BIAS}$ is controlled by the mirror circuit rather than the voltage incrementing circuit and the correct mirror ratio is established, another current source transistor 68 is connected to provide a current of approximately 6 microamperes through a diode 70 to the base of transistor 30. With input terminal 22 open, this current drives the base voltage of transistor 30 up until that transistor ceases conducting. Slightly above this voltage level diode 58 becomes conductive. The output of diode 58 is connected through another diode 72 to $V_{B4}$ which holds the diode 58 output at a level 3 diode drops below V+. The current from source 68 is thereafter routed through diode 58 and a transistor/resistor circuit 74 to constrain $V_{LC}$ to a level approximately 1.4 volts (2 diode drops) below V+ (the turn-on voltage for diode 58). Circuit 74 also diverts current from transistor 56 to avoid gating that element.

Figure 5:
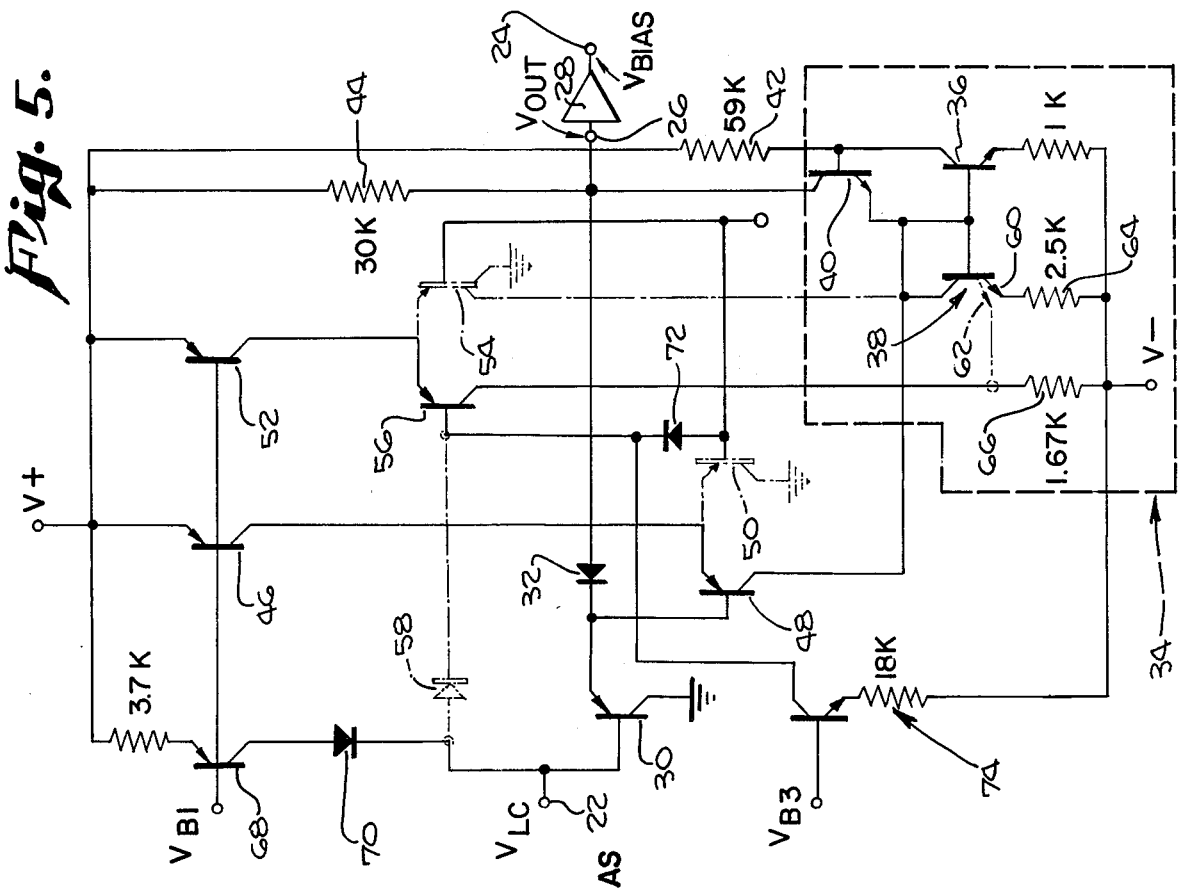

The operation of the logic compatibility circuit will now be described with reference to the graph of FIG. 4 and the circuit diagrams of FIGS. 5–7. Assuming first that $V_{LC}$ is within a relatively low level voltage range corresponding to the first category of logic systems described above, the effective compatibility circuit will be as shown in FIG. 5, nonconductive portions of the circuit being shown in dashed lines. Both transistor 30 and diode 32 are conductive in this mode, so $V_{BIAS}$ is determined by the voltage incrementing circuit. With this voltage level transistors 48 and 56 of the two differential switches are conductive, while the other differential switch transistors 50 and 54 are nonconductive. This pattern causes the current from current source 46 to be directed through the current mirror, in effect bypassing the remainder of the mirror circuit.

The input-output relationship is illustrated in FIG. 4, which plots $V_{BIAS}$ at terminal 24 against the input $V_{LC}$ at terminal 22. A solid line indicates the relationship for a positive supply voltage of 5 volts, a dotted line for 10 volts, and a dashed line for 15 volts. The situation for the first category of logic systems, in which the compatibility circuit functions as indicated in FIG. 5, is shown by sloped lines 76, 76' and 76" to the left of Point A for each of the three positive voltage supply levels. Along these lines $V_{BIAS}$ tracks $V_{LC}$ by a fixed increment of +1.4 volts up to Point A. At this point, which is three diode drops or 2.1 volts below the positive supply level, differential switch 48–50 operates to discontinue the mirror bypass, shifting the mirror current from transistor 48 to resistor 44. This effectively decouples the voltage incrementing circuit from the input and output terminals, since $V_{BIAS}$ is now determined by a combination of V+ and the portion of the mirror current which is routed through resistor 44.

Referring now to FIG. 6, the operation of the compatibility circuit for $V_{LC}$ within a second voltage range greater than the first range is shown. This corresponds to the horizontal lines 78, 78' and 78" to the right of point B for each of the three values of V+. Point B occurs one diode drop or 0.7 volts below V+, and is marked by differential switch 54–56 operating to render transistor 54 conductive and transistor 56 nonconductive. For this range of $V_{LC}$ the voltage incrementing circuit and the mirror bypass through transistor 48 are both inoperative, and are therefore indicated by dashed lines in FIG. 6. Current from transistor source 52 flows through differential switch transistor 54 into mirror element 38 to offset the contribution of V− to the mirror current. The current through resistor 44 is therefore directly proportional to the value of V+, and $V_{BIAS}$ in turn is also directly proportional to V+; a percentage change in V+ is matched by an equal percentage change in $V_{BIAS}$. Since point B occurs at a value of $V_{LC}$ less than V+, the compatibility circuit will be operating on one of lines 78 for the second category of logic systems, in which $V_{LC}$ equals V+. The magnitude of $V_{BIAS}$ relative to $V_{LC}$ for $V_{LC} = V+$ is determined by the mirror ratio; for the double emitter circuit shown in the drawings with both emitters active, a desired ratio of 1:1 is achieved.

The third category of logic systems involves a floating $V_{LC}$ and a fixed $V_{BIAS}$. The compatibility circuit for these conditions is shown in FIG. 7. The base voltage of transistor 30 is elevated by the current from current source 68, as described previously, to turn the transistor off and decouple both the voltage incrementing and the mirror bypass circuits. Circuit 74 prevents differential switch transistor 56 from also being cut off, thereby leaving the other switch transistor 54 nonconductive. In this state the current from offset current source 52 is routed through transistor 56 to resistor 66 at the second emitter of transistor 38. The offset current is thereby removed from the mirror circuit and used instead to reverse bias emitter 62. This alters the mirror ratio to a level at which the current drawn through resistor 44 establishes the desired $V_{BIAS}$ level for the third cateogry of logic systems.

Referring back to FIG. 4, the $V_{LC} - V_{BIAS}$ relationship for this category is shown by the horizontal lines between points A and B. Diode 58 becomes conductive at point C, 1.4 volts (2 diode drops) below V+, which therefore marks the limit of $V_{LC}$'s upward float.

A novel circuit for rendering a DAC automatically compatible with a plurality of different logic systems has thus been shown and described. While a particular embodiment of the invention has been described in detail, numerous additional modifications and variations are possible in light of the above teachings. It is therefore intended that the scope of the invention be limited only in and by the terms of the appended claims.

What is claimed is:

1. A logic compatibility circuit for interfacing a digital to analog converter having positive and negative voltage supplies with logic input signals corresponding to first and second logic systems, such that appropriate threshold switching signals compatible with each logic system are automatically presented to the converter when a logic control signal from either system is applied to the circuit, said first logic system being characterized by a logic control signal within a first voltage range and by a switching threshold which differs from the logic control signals by a fixed increment, said second logic system being characterized by a logic control signal within a second range which is higher in voltage than said first range, and by a switching threshold equal to a substantially fixed proportion of the positive supply voltage, said circuit comprising:

a positive supply voltage bus,
a negative supply voltage bus,
a logic control input terminal,
an output terminal adapted to provide a threshold switching signal to a digital to analog converter,
an impedance circuit connected between said positive bus and said output terminal, the voltage at said output terminal being determined by the current through said impedance circuit,
a voltage incrementing circuit connected to said output terminal to draw current through said impedance circuit and thereby establish an output terminal voltage, said incrementing circuit being connected to said input terminal for biasing such that the current drawn thereby establishes an output signal which differs from the input voltage by a substantially fixed incremental amount, said incrementing circuit including a threshold means adapted to terminate said current drawn when the logic control signal at said input terminal exceeds a predetermined threshold corresponding to the upper limit of said first range, an output circuit connected to said output terminal to draw a current through said impedance circuit, the magnitude of which is directly proportional to said positive bus voltage and sufficient to satisfy the input-output voltage relationship of said second logic system, and a bypass circuit adapted to divert the current drawn by said output circuit away from said impedance circuit when the logic control signal at said input terminal is less than said first range, thereby causing the output terminal voltage to be determined by said voltage incrementing circuit when the logic control voltage at said input terminal is within said first range, and by said output circuit when the logic control voltage is within said second range.

2. The logic compatibility circuit of claim 1, said output circuit comprising a current mirror having a reference circuit connected between said positive and negative buses to provide a reference current the magnitude of which varies in substantially direct proportion to the voltage differential between said buses, and a mirror circuit connected to said output terminal.

3. The logic compatibility circuit of claim 2, said bypass circuit comprising a current source connected through a switch means to supply the current drawn by said mirror circuit, said switch means being connected to terminate said current supply in response to operation of said first threshold means.

4. The logic compatibility of claim 2, further comprising an offset current source connected to supply current to said mirror circuit sufficient to offset the current contribution of said negative voltage supply bus, thus enabling the current drawn through said impedance circuit by said mirror, and thereby the output terminal voltage, to vary in direct proportion to the positive supply voltage.

5. The logic compatibility circuit of claim 2, and further including additional circuitry for interfacing the converter with a third logic system characterized by an open circuit logic control signal and a substantially constant switching threshold for a given positive supply voltage level, said additional circuitry comprising:

a current source means connected to apply a current to said input terminal to elevate the voltage level thereof, current diversion means connected to said input terminal to divert the current applied thereto from said source when the input terminal voltage exceeds a predetermined level between said first and second voltage ranges, thereby maintaining the open circuit input terminal voltage substantially at said predetermined level, and means for altering the mirror ratio of said current mirror from a ratio, for an input logic control voltage within said second range, at which the current drawn through said impedance circuit produces an output terminal voltage compatible with said second logic system, to a ratio for an input logic control voltage at said predetermined level, at which the output terminal voltage is compatible with said third logic system.

6. The logic compatibility circuit of claim 5, said current mirror including a double emitter mirror transistor, the mirror ratio being determined by the pattern of conductive emitters, said ratio altering means comprising a differential switch and controlled by the logic control voltage at said input terminal, and a bias circuit biasing said differential switch to operate when the logic control voltage is substantially equal to the lower limit of said second range, one branch of said switch being connected in circuit with an emitter of said mirror transistor to reverse bias said emitter and thereby establish one mirror ratio when the differential switch is in one state, and to permit forward biasing of said emitter and the establishment of a different mirror ratio when the differential switch is in its other state.

7. The logic compatibility circuit of claim 6, further comprising an offset current source connected to supply current to said mirror circuit sufficient to offset the current contribution of said negative voltage supply bus, thus enabling the current drawn through said impedance circuit by said mirror, and thereby the output terminal voltage, to vary in direct proportion to the positive supply voltage, said offset current source being connected to said mirror through that branch of said differential switch which is conductive when the logic control input voltage is within said second range.

8. The logic compatibility circuit of claim 1, adapted for use with a second logic system in which the logic control signal is substantially equal to the positive supply voltage, and the threshold switching voltage is substantially equal to half the logic control voltage.

9. A logic compatibility circuit for interfacing a digital to analog converter having positive and negative voltage supplies with logic control signals corresponding to first, second, and third logic systems, such that appropriate threshold switching signals compatible with each logic system are automatically presented to the converter when a logic control signal from any of the systems is applied to the circuit, said first logic system being characterized by a logic control signal within a first voltage range and by a switching threshold which differs from the logic control signal by a fixed increment, said second logic system being characterized by a logic control signal within a second voltage range and substantially equal to the positive supply voltage, said second range being at a higher voltage level than said first range, and by a switching threshold equal to a fixed proportion of the positive voltage supply, and said third logic system being characterized by an open circuit logic control signal and by a substantially constant switching threshold for a predetermined positive supply voltage level, said circuit comprising:

a positive voltage bus, a negative voltage bus, a logic control input terminal, an output terminal adapted to provide a threshold switching signal to a digital to analog converter, a voltage incrementing circuit connected between said input and output terminals for constraining the voltage at said output terminal to a value which differs from the voltage at said input terminal by a substantially fixed incremental amount, first threshold means adapted to decouple the incrementing circuit connection between said input and output terminals when the logic control signal at said input terminal exceeds a predetermined threshold corresponding to the upper limit of said first range, a reference current circuit connected between said positive and negative buses to provide a reference current the magnitude of which varies in substantially direct proportion to the voltage differential between said positive and negative buses, a current mirror circuit adapted to proportionately mirror said reference current, said mirror circuit comprising:

a mirror element connected in circuit with said negative voltage bus to proportionately mirror the current in said reference current circuit, a first circuit portion connected between said positive voltage bus and said mirror element, said output terminal being connected to said first circuit portion so that the output voltage level is determined by the combination of the positive bus voltage and the current through said portion, and a second circuit portion comprising an offset current source connected to provide an offset current to said mirror element of a magnitude sufficient to compensate for the contribution to the current through the first portion of said negative voltage bus, thereby enabling the current through the first portion and accordingly the output voltage level to vary in substantially direct proportion to the positive bus voltage when the logic control signal is within said second voltage range, second threshold means adapted to alter the mirror ratio, at a predetermined input terminal voltage corresponding to the lower limit of said second voltage range, from a ratio below said second threshold level at which the output voltage is at the desired level for said third logic system, to a ratio above said second threshold level at which the output voltage is at the desired level for said second logic system, and circuit means for establishing an input terminal voltage level between said first and second threshold levels during an open circuit logic control input.

10. The logic compatibility circuit of claim 9, said second current mirror circuit portion including a switch means connected in circuit with said offset current source and mirror element, said switch means being controlled by the logic control voltage signal at said input terminal to complete a circuit between said offset current source and mirror element when the logic control voltage exceeds a predetermined voltage level corresponding to the lower limit of said second voltage range.

11. The circuit of claim 10, said switch means comprising a first differential switch, a first branch of said differential switch being connected for biasing by the logic control signal at said input terminal, and a second branch switchingly connected in said second current mirror circuit portion.

12. The circuit of claim 11, said mirror element including a current actuable means for altering the mirror ratio, said first differential switch branch being connected in circuit with said ratio altering means to provide said second threshold means.

13. The circuit of claim 12, said mirror element comprising a double emitter transistor, each emitter connected to the negative voltage bus through a respective resistor, the first branch of said differential switch being connected in circuit with the resistor for one emitter to transmit a current thereto sufficient to reverse bias its associated emitter and thereby alter the mirror ratio.

14. The circuit of claim 11, said first logic system being characterized by a threshold switching voltage at the upper limit of its logic control voltage range which exceeds the threshold switching voltage at the lower limit of the logic control voltage range for said second logic system, wherein the first threshold means comprises a second current source and a second differential switch, one branch of said switch being connected in circuit with said input terminal for biasing by the logic control voltage signal, said second differential switch being connected to route the current from said second source to said current mirror element when the logic control signal is below said first threshold level, thereby decreasing the current in the first portion of the mirror circuit to a level at which the output bias voltage is determined by said voltage incrementing circuit, said second differential switch further being connected to divert the current from said second source away from said current mirror element when the logic control signal is greater than said first threshold level, thereby increasing the current in the first portion of the mirror circuit to a level at which that portion determines the output terminal voltage.

15. The circuit of claim 14, said voltage incrementing circuit including a diode means connected to conduct current from the output terminal towards the input terminal, said diode means enabling the logic control input voltage to exceed the output terminal voltage when the logic control voltage exceeds said first threshold level.

16. The circuit of claim 14, said first current mirror branch circuit including a resistor means connected in circuit between said positive voltage bus and said mirror element, said output terminal and voltage incrementing circuit each being connected to said first branch circuit on the mirror element side of said resistor means, whereby the output voltage varies in negative proportion to the current through said first branch circuit for a given positive supply voltage.

17. The circuit of claim 14, including means to apply a common voltage to one arm of each of said first and second differential switches, the other arms of said switches being connected for control by a logic control signal at said input terminal by circuits which are adapted to present switching voltages to said first and second differential switches which are respectively less and greater than said logic control signal, thereby causing the second differential switch to operate at a lower logic control signal than the first differential switch.

18. The circuit of claim 9, wherein said means for establishing the input terminal voltage level during an open circuit logic control input comprises a PNP transistor in said voltage incrementing circuit having its bus connected to said input terminal, a current source means connected to supply a current to the base of said transistor to elevate the voltage level thereof, and current diversion means connected to said transistor base to divert the current supplied thereto by said source when the base and input terminal voltages exceed a predetermined level between said first and second voltage ranges.

19. A logic compatibility circuit for interfacing a digital to analog converter having positive and negative voltage supplies with logic input signals corresponding to first, second, and third logic systems, such that appropriate threshold switching signals compatible with each logic system are automatically presented to the converter when a logic control signal from any of the systems is applied to the circuit, said first logic system being characterized by a logic control signal within a first voltage range and by a switching threshold which differs from the logic control signal by a fixed increment, said second logic system being characterized by a logic control signal within a second voltage range substantially equal to the positive supply voltage, said second range being at a higher voltage level than said first range, and by a switching threshold equal to a fixed proportion of the positive supply voltage, and said third logic system being characterized by an open circuit logic control signal and by a substantially constant switching threshold for a predetermined positive supply voltage level, said circuit comprising:

a logic control input terminal,
a positive voltage bus,
a negative voltage bus,
an output terminal adapted to provide threshold switching signal to a digital to analog converter,
a current mirror having a reference circuit connected between said positive and negative buses to draw a reference current the magnitude of which is proportional to the voltage differential between said buses, and a mirror circuit connected between said output terminal and the negative bus to draw a current proportional to the reference current, said mirror circuit including a double emitter transistor mirror element,
a resistance means connected between said output terminal and said positive bus,
an offset current source connected to said mirror circuit to supply the mirror current attributable to said negative bus, whereby the remainder of the mirror current attributable to the positive bus is routed to the mirror through said resistance means,
a differential switch having a first branch connected in circuit between said offset current source and said mirror circuit, the second branch of said switch being connected between said offset current source and one emitter of said transistor mirror element to reverse bias said emitter,
the mirror ratio being selected to produce a current magnitute through said resistance means which establishes an output terminal voltage satisfying the logic control-threshold switching relationship for the second logic system when both emitters of the transistor element are conductive, and for the third logic system when said one emitter is reverse biased,
means biasing said differential switch to render the first branch conductive when the logic control voltage applied to the input terminal is above a level corresponding to the lower limit of said second range, and to render the second branch conductive when the logic control voltage is less than said level,
a voltage incrementing circuit connected between said input and output terminals, comprising a grounded collector PNP transistor having its base connected to said input terminal, and a diode means connected to conduct current from said output terminal to the emitter of said transistor, current source means adapted to produce a current sufficient to supply the difference between the mirror current and the current carried by said resistance means when the input logic control signal is within said first range, and a switching circuit connecting said current source means with said mirror transistor, and means biasing said switching circuit to complete said connection when the logic control signal is at a level less than the level corresponding to the upper limit of said first range, and to break said connection when the logic control signal is at a higher voltage level.

20. The logic compatibility circuit of claim 19, and further including a current source means connected to the base of said PNP transistor to provide a current thereto sufficient to reverse bias said transistor and open said switching circuit during an open circuit logic control signal, and a current diversion circuit connected to divert said current when the input terminal voltage is at a level between said first and second ranges and thereby prevent said differential switch from changing state.

* * * * *